(12) United States Patent
Satou et al.

(10) Patent No.: US 10,741,464 B2
(45) Date of Patent: Aug. 11, 2020

(54) ACTIVE ESTER RESIN AND CURED PRODUCT THEREOF

(71) Applicant: DIC Corporation, Tokyo (JP)

(72) Inventors: Yutaka Satou, Ichihara (JP); Tatsuya Okamoto, Ichihara (JP); Akito Kawasaki, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 16/313,269

(22) PCT Filed: Jun. 22, 2017

(86) PCT No.: PCT/JP2017/022996
§ 371 (c)(1),
(2) Date: Dec. 26, 2018

(87) PCT Pub. No.: WO2018/008410
PCT Pub. Date: Jan. 11, 2018

(65) Prior Publication Data
US 2019/0172768 A1    Jun. 6, 2019

(30) Foreign Application Priority Data

Jul. 6, 2016 (JP) ................................. 2016-134227
Jul. 15, 2016 (JP) ................................. 2016-140419

(51) Int. Cl.
*H01L 23/29* (2006.01)
*H01L 23/31* (2006.01)
(Continued)

(52) U.S. Cl.
CPC ............ *H01L 23/293* (2013.01); *C08G 59/02* (2013.01); *C08G 59/4223* (2013.01);
(Continued)

(58) Field of Classification Search
CPC ....... H01L 23/293; H01L 23/29; H01L 23/31; C08G 59/4223; C08G 59/02;
(Continued)

(56) References Cited

U.S. PATENT DOCUMENTS

2014/0151094 A1    6/2014 Takeuchi et al.
2015/0024173 A1*   1/2015 Tahara ............... G03F 7/0233
                                                           428/195.1

FOREIGN PATENT DOCUMENTS

JP    2001-146511 A    5/2001
JP    2002-121356 A    4/2002
(Continued)

OTHER PUBLICATIONS

International Search Report dated Sep. 19, 2017, issued for PCT/JP2017/022996.

*Primary Examiner* — Vu A Vu
(74) *Attorney, Agent, or Firm* — Locke Lord LLP (57) ABSTRACT

Provided are an active ester resin capable of having low cure shrinkage and forming a cured product having a low dielectric loss tangent, a curable resin composition including the ester resin, a cured product of the resin composition, a printed wiring board, and a semiconductor encapsulating material. The active ester resin includes a product of reaction of essential raw materials including: a phenolic hydroxyl group-containing compound (A); a polynaphthol resin (B) having a molecular structure in which naphthol compound (b) moieties are linked with an aromatic ring- or cyclo ring-containing structural moiety (α); and an aromatic polycarboxylic acid or an acid halide thereof (C). Also provided are a curable resin composition including the ester resin, a cured product of the resin composition, a printed wiring board, and a semiconductor encapsulating material.

20 Claims, 5 Drawing Sheets

(51) Int. Cl.
    *C08G 59/42* (2006.01)
    *C08G 59/02* (2006.01)
    *H05K 1/03* (2006.01)
    *C08G 63/133* (2006.01)
    *C08L 63/00* (2006.01)
    *C08L 67/02* (2006.01)

(52) U.S. Cl.
    CPC ............ *C08G 63/133* (2013.01); *C08L 63/00* (2013.01); *C08L 67/02* (2013.01); *H01L 23/29* (2013.01); *H01L 23/31* (2013.01); *H05K 1/03* (2013.01); *C08L 2203/206* (2013.01)

(58) Field of Classification Search
    CPC .............. C08G 63/133; C08G 59/4276; C08G 63/916; C08L 63/00; C08L 67/02; C08L 2203/206; H05K 1/0326; H05K 1/03
    USPC ........................................................ 257/788
    See application file for complete search history.

(56) References Cited

FOREIGN PATENT DOCUMENTS

| | | |
|---|---|---|
| JP | 2004-169021 A | 6/2004 |
| WO | 2012/165317 A1 | 12/2012 |

\* cited by examiner

ACTIVE ESTER RESIN AND CURED PRODUCT THEREOF

TECHNICAL FIELD

The present invention relates to an active ester resin capable of having low cure shrinkage and forming a cured product having a low dielectric loss tangent; a curable resin composition including the ester resin; a cured product of the resin composition; a printed wiring board; and a semiconductor encapsulating material.

BACKGROUND ART

In the technical field for insulating materials that are used for semiconductors, multilayer printed substrates, and the like, along with the thickness reduction of various electronic members, or with speed improvement and frequency increase of signals, there is a demand for the development of new resin materials in accordance with these market trends. For example, as a result of thickness reduction of electronic members, heat-induced "warpage" of those members becomes noticeable, and in order to suppress this, development of resin materials having low cure shrinkage and high dimensional stability is in progress. Furthermore, in regard to the speed improvement and frequency increase of signals, in order to reduce energy loss caused by heat generation or the like, development of resin materials that produce cured products having low values for both the dielectric constant and the dielectric loss tangent is in progress.

In a known technology, a resin material capable of forming a cured product having a relatively low dielectric constant and a relatively low dielectric loss tangent, such as an active ester resin obtained by esterifying a dicyclopentadiene phenol resin and α-naphthol with phthalic acid chloride, is used as a curing agent for epoxy resins (see PTL 1 described below). The active ester resin described in PTL 1 is characterized by being capable of forming a cured product having a low dielectric constant and a low dielectric loss tangent as compared with the case of using a curing agent of a conventional type such as a phenol novolac resin. However, the active ester resin does not meet the level of market requirements in recent years, and particularly, there is a demand for a further reduction in the value of the dielectric loss tangent. Furthermore, there is a demand for a further reduction in the cure shrinkage.

CITATION LIST

Patent Literature

PTL 1: JP-A-2004-169021

SUMMARY OF INVENTION

Technical Problem

Therefore, an object to be solved by the present invention is to provide an active ester resin capable of having low cure shrinkage and forming a cured product having a low dielectric loss tangent; a curable resin composition including the ester resin; a cured product of the resin composition; a printed wiring board; and a semiconductor encapsulating material.

Solution to Problem

The inventors have conducted a thorough investigation in order to solve the problems described above, and as a result, the inventors have found that an active ester resin including a product of reaction of essential raw materials, including a phenolic hydroxyl group-containing compound, a polynaphthol resin having a molecular structure in which naphthol compound moieties are linked with an aromatic ring- or cyclo ring-containing structural moiety, and an aromatic polycarboxylic acid or an acid halide thereof, has low cure shrinkage and is capable of forming a cured product having a very low dielectric loss tangent. Thus, the inventors have completed the invention.

Specifically, the invention relates to an active ester resin including a product of reaction of essential raw materials including: a phenolic hydroxyl group-containing compound (A); a polynaphthol resin (B) having a molecular structure in which naphthol compound (b) moieties are linked with an aromatic ring- or cyclo ring-containing structural moiety (α); and an aromatic polycarboxylic acid or an acid halide thereof (C).

The invention further relates to a curable resin composition including the above active ester resin and a curing agent.

The invention further relates to a cured product of the above curable resin composition.

The invention further relates to a printed wiring board produced using the above curable resin composition.

The invention further relates to a semiconductor encapsulating material including the above curable resin composition.

Advantageous Effects of Invention

The invention makes it possible to provide an active ester resin capable of having low cure shrinkage and forming a cured product having a low dielectric loss tangent, a curable resin composition including the ester resin, a cured product of the resin composition, a printed wiring board, and a semiconductor encapsulating material.

DESCRIPTION OF EMBODIMENTS

Hereinafter, the invention will be described in detail.

An active ester resin according to the invention includes a product of reaction of raw materials including: a phenolic hydroxyl group-containing compound (A); a polynaphthol resin (B) having a molecular structure in which naphthol compound (b) moieties are linked with an aromatic ring- or cyclo ring-containing structural moiety; and an aromatic polycarboxylic acid or an acid halide thereof (C).

The phenolic hydroxyl group-containing compound (A) may be any compound as long as it is an aromatic compound having a hydroxyl group on the aromatic ring, and there are no particular limitations on other specific structures thereof. In the invention, regarding the phenolic hydroxyl group-containing compound (A), one kind may be used alone, or two or more kinds thereof may be used in combination. The phenolic hydroxyl group-containing compound (A) may be specifically phenol, naphthol, anthracenol, or a compound having one substituent or a plurality of substituents on any of these aromatic nuclei. Examples of the substituent on the aromatic nucleus include aliphatic hydrocarbon groups such as a methyl group, an ethyl group, a vinyl group, a propyl group, a butyl group, a pentyl group, a hexyl group, a cyclohexyl group, a heptyl group, an octyl group, and a nonyl group; alkoxy groups such as a methoxy group, an ethoxy group, a propyloxy group, and a butoxy group; halogen atoms such as a fluorine atom, a chlorine atom, and a bromine atom; a phenyl group, a naphthyl group, an anthryl group, and aryl groups substituted with the above-mentioned aliphatic hydrocarbon groups, alkoxy groups, halogen atoms, and the like on these aromatic nuclei; and a phenylmethyl group, a phenylethyl group, a naphthylmethyl group, a naphthylethyl group, and aralkyl groups substituted with the above-mentioned aliphatic hydrocarbon groups, alkoxy groups, halogen atoms, and the like on these aromatic nuclei.

Among these, from the viewpoint of obtaining an active ester resin that has low cure shrinkage and gives a cured product having a low dielectric loss tangent, a naphthol compound is preferred, and 1-naphthol or 2-naphthol is particularly preferred.

In regard to the polynaphthol resin (B), the naphthol compound (b) may be any compound as long as it is a compound having one phenolic hydroxyl group on the naphthalene ring, and the position of substitution of the phenolic hydroxyl group, the presence or absence of other substituents, and the like are not particularly limited. Furthermore, regarding the naphthol compound (b), one kind may be used alone, or two or more kinds thereof may be used in combination. Specific examples of the naphthol compound (b) include 1-naphthol, 2-naphthol, and compounds having one substituent or a plurality of substituents on these aromatic nuclei. Examples of the substituent on the aromatic nuclei include aliphatic hydrocarbon groups such as a methyl group, an ethyl group, a vinyl group, a propyl group, a butyl group, a pentyl group, a hexyl group, a cyclohexyl group, a heptyl group, an octyl group, and a nonyl group; alkoxy groups such as a methoxy group, an ethoxy group, a propyloxy group, and a butoxy group; halogen atoms such as a fluorine atom, a chlorine atom, and a bromine atom; a phenyl group, a naphthyl group, an anthryl group, and aryl groups substituted with the above-mentioned aliphatic hydrocarbon groups, alkoxy groups, halogen atoms, and the like on these aromatic nuclei; a phenylmethyl group, a phenylethyl group, a naphthylmethyl group, a naphthylethyl group, and aralkyl groups substituted with the above-mentioned aliphatic hydrocarbon groups, alkoxy groups, halogen atoms, and the like on these aromatic nuclei.

Among these, from the viewpoint of obtaining an active ester resin that has low cure shrinkage and gives a cured product having a low dielectric loss tangent, 1-naphthol or 2-naphthol is preferred.

The polynaphthol resin (B) having a molecular structure in which naphthol compound (b) moieties are linked with an aromatic or cyclo ring-containing structural moiety may have, for example, a molecular structure represented by the following structural formula (1):

[Chem. 1]

(1)

wherein X represents an aromatic ring- or cyclo ring-containing structural moiety ($\alpha$); $R^1$'s each independently represent any one of an aliphatic hydrocarbon group, an alkoxy group, a halogen atom, an aryl group, an aralkyl group, and a structural moiety ($\beta$) represented by the following structural formula (2):

[Chem. 2]

(2)

wherein X represents an aromatic nucleus- or cyclo ring-containing structural moiety; $R^1$'s each independently represent any one of an aliphatic hydrocarbon group, an alkoxy group, a halogen atom, an aryl group, an aralkyl group, and a structural moiety ($\beta$) represented by structural formula (2), and each of $R^1$'s may be bonded to any carbon atom forming the naphthalene ring; m represents 0 or an integer of 1 to 4; and n represents an integer of 1 to 10, while each of R''s may be bonded to any carbon atom forming the naphthalene ring; m represents 0 or an integer of 1 to 4; and n represents an integer of 1 to 10.

In structural formulas (1) and (2) above, the aromatic nucleus- or cyclo ring-containing structural moiety ($\alpha$), which is represented by X, may be a structural moiety represented by, for example, any one of the following structural formulas (X-1) to (X-5):

[Chem. 3]

(X-1)

-continued wherein h represents 0 or 1; $R^2$'s each independently represent any one of an aliphatic hydrocarbon group, an alkoxy group, a halogen atom, an aryl group, and an aralkyl group; i represents 0 or an integer of 1 to 4; $R^3$ represents a hydrogen atom or a methyl group; Y represents any one of an alkylene group having 1 to 4 carbon atoms, an oxygen atom, a sulfur atom, and a carbonyl group; and j represents an integer of 1 to 4.

$R^2$'s in structural formulas (X-1) to (X-5) above each independently represent any one of an aliphatic hydrocarbon group, an alkoxy group, a halogen atom, an aryl group, and an aralkyl group; and specific examples include aliphatic hydrocarbon groups such as a methyl group, an ethyl group, a vinyl group, a propyl group, a butyl group, a pentyl group, a hexyl group, a cyclohexyl group, a heptyl group, an octyl group, and a nonyl group; alkoxy groups such as a methoxy group, an ethoxy group, a propyloxy group, and a butoxy group; halogen atoms such as a fluorine atom, a chlorine atom, and a bromine atom; a phenyl group, a naphthyl group, an anthryl group, and aryl groups substituted with the above-mentioned aliphatic hydrocarbon groups, alkoxy groups, halogen atoms, and the like on these aromatic nuclei; a phenylmethyl group, a phenylethyl group, a naphthylmethyl group, a naphthylethyl group, and aralkyl groups substituted with the above-mentioned aliphatic hydrocarbon groups, alkoxy groups, halogen atoms, and the like on these aromatic nuclei.

$R^1$'s in structural formulas (1) and (2) above each independently represent any one of an aliphatic hydrocarbon group, an alkoxy group, an aryl group, an aralkyl group, a halogen atom, and a bonding point connected to the structural moiety (β) represented by structural formula (2) via X. Among these, examples of the aliphatic hydrocarbon group, alkoxy group, halogen atom, aryl group, and aralkyl group are the same as the examples listed above as the substituent on the aromatic nucleus on the naphthol compound (b).

The polynaphthol resin (B) may be produced by any method capable of producing a molecular structure in which naphthol compound (b) moieties are linked with an aromatic ring- or cyclo ring-containing structural moiety (α).

Examples of the polynaphthol resin (B) include products of reaction of essential raw materials including the naphthol compound (b) and a compound (x) represented by any one of the following structural formulas (x-1) to (x-5):

[Chem. 4]

wherein h represents 0 or 1; $R^2$'s each independently represent any one of an aliphatic hydrocarbon group, an alkoxy group, a halogen atom, an aryl group, and an aralkyl group; i represents 0 or an integer of 1 to 4; Z represents any one of a vinyl group, a halomethyl group, a hydroxymethyl group, and an alkyloxymethyl group; Y represents any one of an alkylene group having 1 to 4 carbon atoms, an oxygen atom, a sulfur atom, and a carbonyl group; and j represents an integer of 1 to 4.

$R^2$'s in the above structural formulas (x-1) to (x-5) each independently represent any one of an aliphatic hydrocarbon group, an alkoxy group, a halogen atom, an aryl group, and an aralkyl group, and these have the same meanings as those defined for $R^2$ in the above structural formulas (X-1) to (X-5).

Z in structural formulas (x-1) to (x-5) is not particularly limited as long as it is a functional group capable of forming a bond with an aromatic ring of the naphthol compound (b), and specific examples include a vinyl group, a halomethyl group, a hydroxymethyl group, and an alkyloxymethyl group.

Besides the naphthol compound (b) and the compound (x), other compounds may be used as raw materials in the reaction to form the polynaphthol resin (B). Examples of such other compounds include compounds (x') other than the compound (x), such as formaldehyde and an aliphatic aldehyde, capable of linking the naphthol compound (b); and a substituent-introducing agent (y) for introducing an aliphatic hydrocarbon group, an alkoxy group, a halogen atom, an aryl group, or an aralkyl group as $R^1$ in the above structural formula (1) or (2) or as $R^2$ in the above structural formulas (X-1) to (X-5).

In the invention, the use of the compound (x') is sufficiently effective in lowering the cure shrinkage and producing a cured product having a low dielectric loss tangent. Thus, the content of the compound (x) is preferably 80% by mass or more, and preferably 95% by mass or more, based on the total amount of the compound (x) and the compound (x').

Examples of the substituent-introducing agent (y) include aralkyl group-introducing agents such as a phenylmethanol compound, a phenylmethyl halide compound, a naphthylmethanol compound, a naphthylmethyl halide compound, and a styrene compound.

The reaction between the naphthol compound (b) and the compound (x) can be carried out by, for example, a method of using the naphthol compound (b) in an amount in the range of 2 to 10 mol with respect to 1 mol of the compound (x), and heating and stirring the compounds under the temperature conditions of about 80° C. to 180° C. under acid catalyst conditions. The reaction may also be carried out in an organic solvent as necessary. After completion of the reaction, any excess amount of the naphthol compound (b) may be distilled off or the like, if desired. Furthermore, any unreacted naphthol compound in the reaction mixture may also be used directly as the phenolic hydroxyl group-containing compound (A).

Examples of the acid catalyst include para-toluenesulfonic acid, dimethyl sulfuric acid, diethyl sulfuric acid, sulfuric acid, hydrochloric acid, and oxalic acid. These may be used singly, or two or more kinds thereof may be used in combination. Regarding the amount of addition of the acid catalyst, it is preferable to use the acid catalyst in an amount in the range of 0.01% to 10% by mass with respect to the naphthol compound (b).

Examples of the organic solvent include ketone solvents such as acetone, methyl ethyl ketone, and cyclohexanone; acetic acid ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; dimethylformamide, dimethylacetamide, and N-methylpyrrolidone. These may be used singly, or may be used as mixed solvents of two or more kinds thereof.

An example of the specific structure of the polynaphthol resin (B) is represented by, for example, structural formula (B-1) below, which is produced using naphthol as the naphthol compound (b) and divinylbenzene (a compound represented by structural formula (x-2) in which two Z's are vinyl groups, and i is 0) as the compound (x). Meanwhile, the following structural formula (B-1) is merely an example of the specific structure of the polynaphthol resin (B), and it is not intended to exclude any other resin structures that may be produced by a reaction between the naphthol compound (b) and the compound (x).

[Chem. 5]

(B-1)

wherein n represents an integer of 1 to 10; and R's each independently represent a hydrogen atom or a structural moiety represented by the following structural formula (R-1).

[Chem. 6]

(R-1)

Furthermore, divinylbenzene products that are generally commercially available may partially include ethylstyrene. In this case, a structure represented by the following structural formula (R-2) may be partially introduced as R in structural formula (B-1).

[Chem. 7]

(R-2)

From the viewpoint of obtaining an active ester resin that has high solvent solubility and is likely to be utilized in various use applications, the hydroxyl group equivalent of the polynaphthol resin (B) is preferably in the range of 150 to 300 g/equivalent.

Regarding the aromatic polycarboxylic acid or an acid halide thereof (C), the specific structure is not particularly limited as long as the compound is an aromatic compound that can react with a phenolic hydroxyl group carried by the phenolic hydroxyl group-containing compound (A) and the polynaphthol resin (B) and form an ester bond, and any compound may be used. Specific examples include benzenedicarboxylic acids such as isophthalic acid and terephthalic acid; benzenetricarboxylic acids such as trimellitic acid; naphthalenedicarboxylic acids such as naphthalene-1,4-dicarboxylic acid, naphthalene-2,3-dicarboxylic acid, naphthalene-2,6-dicarboxylic acid, and naphthalene-2,7-dicarboxylic acid; acid halides thereof; and compounds substituted with the above-mentioned aliphatic hydrocarbon groups, alkoxy groups, halogen atoms, and the like on these aromatic nuclei. Examples of the acid halides include acid chlorides, acid bromides, acid fluorides, and acid iodides. These may be used singly, or two or more kinds thereof may be used in combination. Among them, from the viewpoint of obtaining an active ester resin having high reaction activity and excellent curability, a benzenedicarboxylic acid such as isophthalic acid or terephthalic acid, or an acid halide thereof is preferred.

The reaction between the phenolic hydroxyl group-containing compound (A), the polynaphthol resin (B), and the aromatic polycarboxylic acid or an acid halide thereof (C) can be carried out by, for example, a method of heating and stirring the compounds under the temperature conditions of about 40° C. to 65° C. in the presence of an alkali catalyst. The reaction may be carried out in an organic solvent, as necessary. Furthermore, after completion of the reaction, the reaction product may be purified by washing with water, reprecipitation, or the like, if desired.

Examples of the alkali catalyst include sodium hydroxide, potassium hydroxide, triethylamine, and pyridine. These may be used singly, or two or more kinds thereof may be used in combination. Furthermore, the alkali catalyst may also be used as an aqueous solution at about 3.0% to 30%. Above all, sodium hydroxide or potassium hydroxide, both of which have high catalytic activity, is preferred.

Examples of the organic solvent include ketone solvents such as acetone, methyl ethyl ketone, and cyclohexanone; acetic acid ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; dimethylformamide, dimethylacetamide, and N-methylpyrrolidone. These may be used singly, or may be used as mixed solvents of two or more kinds thereof.

The reaction proportions of the phenolic hydroxyl group-containing compound (A), the polynaphthol resin (B), and the aromatic polycarboxylic acid or an acid halide thereof (C) can be varied as appropriate according to the desired molecular design. Above all, from the viewpoint of obtaining an active ester resin that has high solvent solubility and is likely to be utilized in various use applications, the ratio between the number of moles of hydroxyl groups ($A_{OH}$) in the phenolic hydroxyl group-containing compound (A) and the number of moles of hydroxyl groups ($B_{OH}$) in the polynaphthol resin (B), [($A_{OH}$)/($B_{OH}$)], is preferably 10/90 to 75/25, and more preferably 25/75 to 50/50. Furthermore, the total of the number of moles of hydroxyl groups in the phenolic hydroxyl group-containing compound (A) and the number of moles of hydroxyl groups in the polynaphthol resin (B) is preferably 0.95 to 1.05 moles based on 1 mole of the total amount of carboxyl groups or acid halide groups in the aromatic polycarboxylic acid or an acid halide thereof (C).

The active ester resin of the invention may contain an ester compound (AC) between the phenolic hydroxyl group-containing compound (A) and the aromatic polycarboxylic acid or an acid halide thereof (C). The ester compound (AC) can be produced as one component of the active ester resin, by adjusting the reaction proportion of the phenolic hydroxyl group-containing compound (A), the polynaphthol resin (B), and the aromatic polycarboxylic acid or an acid halide thereof (C).

As an example of the specific structure of the ester compound (AC), for example, a structural example obtainable in the case of using a naphthol compound as the phenolic hydroxyl group-containing compound (A) and using a benzenedicarboxylic acid or an acid halide thereof as the aromatic polycarboxylic acid or an acid halide thereof (C), is represented by the following structural formula (3). Meanwhile, the following structural formula (3) is merely an example of the specific structure of the ester compound (AC), and it is not intended to exclude diester compounds having other molecular structures.

[Chem. 8]

(3)

wherein $R^4$'s each independently represent any one of an aliphatic hydrocarbon group, an alkoxy group, a halogen atom, an aryl group, and an aralkyl group, or may be bonded to any carbon atom forming the naphthalene ring; and p represents 0 or an integer of 1 to 3.

The content of the ester compound (AC) in a case in which the active ester resin contains the ester compound (AC) is preferably less than 40%, and particularly preferably in the range of 1% to 30%, with respect to the active ester resin, from the viewpoint that an active ester resin having low cure shrinkage and excellent curability is obtained.

The content of the ester compound (AC) in the active ester resin is a value calculated from the area ratio of a GPC chart measured under the following conditions.

Measuring apparatus: "HLC-8320 GPC" manufactured by Tosoh Corporation
Column: Guide column "HXL-L" manufactured by Tosoh Corporation
+"TSK-GEL G4000HXL" manufactured by Tosoh Corporation
+"TSK-GEL G3000HXL" manufactured by Tosoh Corporation
+"TSK-GEL G2000HXL" manufactured by Tosoh Corporation
+"TSK-GEL G2000HXL" manufactured by Tosoh Corporation
Detector: RI (differential refractometer)
Data processing: "GPC Workstation EcoSEC-WorkStation" manufactured by Tosoh Corporation
Measurement conditions: Column temperature 40° C.
Developing solvent tetrahydrofuran
Flow rate 1.0 ml/min
Standards: The following monodisperse polystyrenes having known molecular weights were used according to the measurement manual of "GPC-8320".
(Polystyrenes Used)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation
Sample: A tetrahydrofuran solution having a concentration of 1.0% by mass in terms of the resin solid content was filtered through a microfilter (50 μl) and used.

The weight average molecular weight (Mw) of the active ester resin of the invention is preferably in the range of 600 to 5,000, and particularly preferably in the range of 800 to 3,000, from the viewpoint that an active ester resin having low cure shrinkage is obtained. Meanwhile, the weight average molecular weight (Mw) of the active ester resin is a value measured by GPC under the same conditions as those used at the time of determining the content of the ester compound (AC).

Furthermore, the softening point of the active ester resin of the invention is a value measured based on JIS K7234 and is preferably in the range of 100° C. to 180° C., and more preferably in the range of 120° C. to 170° C.

From the viewpoint that an active ester resin having low cure shrinkage and excellent curability is obtained, the functional group equivalent of the active ester resin of the invention is preferably in the range of 210 to 360 g/equivalent, and particularly preferably in the range of 220 to 300 g/equivalent. Meanwhile, the functional groups in the active ester resin according to the invention refer to an ester bond moiety and a phenolic hydroxyl group in the active ester resin. Furthermore, the functional group equivalent of the active ester resin is a value calculated from the feed amounts of the reaction raw materials.

The curable resin composition of the invention includes the above-mentioned active ester resin and a curing agent. The curing agent may be any compound capable of reacting with the active ester resin of the invention, and various compounds can be utilized without any particular limitations. Examples of the curing agent include an epoxy resin.

Examples of the epoxy resin include a phenol novolac type epoxy resin, a cresol novolac type epoxy resin, a naphthol novolac type epoxy resin, a bisphenol novolac type epoxy resin, a biphenol novolac type epoxy resin, a bisphenol type epoxy resin, a biphenyl type epoxy resin, a triphenolmethane type epoxy resin, a tetraphenolethane type epoxy resin, a dicyclopentadiene phenol addition reaction type epoxy resin, a phenol aralkyl type epoxy resin, and a naphthol aralkyl type epoxy resin.

In the case of using an epoxy resin as the curing agent, another curing agent for epoxy resin may also be used in combination, in addition to the active ester resin of the invention. Examples of the other curing agent for epoxy resin used herein include amine compounds such as diaminodiphenylmethane, diethylenetriamine, triethylenetetramine, diaminodiphenylsulfone, isophoronediamine, imidazole, a $BF_3$-amine complex, and a guanidine derivative; amide compounds such as dicyandiamide, and a polyamide resin synthesized from a linolenic acid dimer and ethylenediamine; acid anhydrides such as phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride; and phenolic resins such as a phenol novolac resin, a cresol novolac resin, a naphthol novolac resin, a bisphenol novolac resin, a biphenyl novolac resin, a dicyclopentadiene phenol addition type resin, a phenol aralkyl resin, a naphthol aralkyl resin, a triphenolmethane type resin, a tetraphenolethane type resin, and an aminotriazine-modified phenolic resin.

The mixing proportions of the active ester resin of the invention, the epoxy resin, and the other curing agent composition for epoxy resin are preferably proportions that make the total amount of the functional groups in the active ester resin and the other curing agent for epoxy resin 0.7 to 1.5 mol with respect to 1 mol of the total amount of the epoxy groups in the epoxy resin.

The curable resin composition of the invention may also include, in addition to those components described above, a cyanic acid ester resin, a bismaleimide resin, a benzoxazine resin, a styrene-maleic anhydride resin, an allyl group-containing resin represented by diallyl bisphenol or triallyl isocyanurate, a polyphosphoric acid ester, a phosphoric acid ester-carbonate copolymer, or the like. These may be sued singly, or two or more kinds thereof may be used in combination.

The curable resin composition of the invention may also include various additives such as a curing accelerator, a flame retardant, an inorganic filler material, a silane coupling agent, a mold release agent, a pigment, and an emulsifier, as necessary.

Examples of the curing accelerator include a phosphorus-based compound, a tertiary amine, an imidazole compound, a pyridine compound, an organic acid metal salt, a Lewis acid, and an amine complex salt. Among them, from the viewpoint of having excellent curability, heat resistance, electrical characteristics, moisture-resistant reliability, and the like, the phosphorus-based compound is preferably triphenylphosphine, the tertiary amine is preferably 1,8-diazabicyclo[5.4.0]-undecene (DBU), the imidazole compound is preferably 2-ethyl-4-methylimidazole, and the pyridine compound is preferably 4-dimethylaminopyridine.

Examples of the flame retardant include inorganic phosphorus compounds including red phosphorus, ammonium phosphates such as monoammonium phosphate, diammonium phosphate, triammonium phosphate, and ammonium polyphosphate, and phosphoric acid amide; organic phosphorus compounds including a phosphoric acid ester compound, a phosphonic acid compound, a phosphinic compound, a phosphine oxide compound, a phosphorane compound, an organic nitrogen-containing phosphorus compound, cyclic organic phosphorus compounds such as 9,10-dihydro-9-oxa-10-phosphaphenanthrene-10-oxide, 10-(2,5-dihydrooxyphenyl)-10H-9-oxa-10-phosphaphenanthrene-10-oxide, and 10-(2,7-dihydrooxynaphthyl)-10H-9-oxa-10-phosphaphenanthrene-10-oxide, and derivatives obtained by reacting those compounds with compounds such as an epoxy resin and a phenolic resin; nitrogen-based flame retardants such as a triazine compound, a cyanuric acid compound, an isocyanuric acid compound, and phenothiazine; silicone-based flame retardants such as a silicone oil, a silicone rubber, and a silicone resin; and inorganic flame retardants such as a metal hydroxide, a metal oxide, a metal carbonate compound, a powdered metal, a boron compound, and a low-melting point glass. In the case of using these flame retardants, the content is preferably in the range of 0.1% to 20% by mass in the curable resin composition.

The inorganic filler material is incorporated, for example, in a case in which the curable resin composition of the invention is used for semiconductor encapsulating material applications. Examples of the organic filler material include fused silica, crystalline silica, alumina, silicon nitride, and aluminum hydroxide. Among them, since an inorganic filler material can be incorporated in a larger quantity, the fused silica is preferred. Regarding the fused silica, any of a crushed form and a spherical form can be used; however, in order to increase the amount of incorporation of fused silica and to suppress an increase in the melt viscosity of the curable composition, it is preferable to use mainly a spherical-shaped fused silica. Furthermore, in order to increase the amount of incorporation of spherical silica, it is preferable that the particle size distribution of the spherical silica is adjusted appropriately. Regarding the filling ratio, it is preferable to incorporate the spherical silica in an amount in the range of 0.5 parts to 95 parts by mass in 100 parts by mass of the curable resin composition.

In addition to this, in a case in which the curable resin composition of the invention is used for use applications such as an electroconductive paste, electroconductive fillers such as powdered silver and powdered copper can be used.

As described above, the active ester resin of the invention has excellent performance such as low cure shrinkage and a low dielectric loss tangent in the cured product. In addition to this, the active ester resin also has sufficiently high general requisite performance that is required from a resin material, such as solubility in general-purpose organic solvents and curability with an epoxy resin. Thus, the active ester resin can be widely utilized for electronic material applications such as a printed wiring board, a semiconductor encapsulating material, and a resist material, as well as for applications such as a coating material, an adhesive, and a molded article.

In the case of using the curable resin composition of the invention for a printed wiring board application or a build-up adhesive film application, generally, it is preferable to use the curable resin composition after incorporating an organic solvent into the resin composition and diluting the composition. Examples of the organic solvent include methyl ethyl ketone, acetone, dimethylformamide, methyl isobutyl ketone, methoxypropanol, cyclohexanone, methyl cellosolve, ethyl diglycol acetate, and propylene glycol monomethyl ether acetate. The type or the amount of incorporation of the organic solvent can be appropriately adjusted according to the use environment of the curable resin composition; however, for example, for a printed wiring board application, the organic solvent is preferably a polar solvent having a boiling point of 160° C. or lower, such as methyl ethyl ketone, acetone, or dimethylformamide. It is preferable to use the solvent at a proportion such that the non-volatile fraction is 40% to 80% by mass. For a build-up adhesive film application, it is preferable to use a ketone solvent such as acetone, methyl ethyl ketone, or cyclohexanone; an acetic acid ester solvent such as ethyl acetate, butyl acetate, cellosolve acetate, propylene glycol monomethyl ether acetate, or carbitol acetate; a carbitol solvent such as cellosolve or butyl carbitol; an aromatic hydrocarbon solvent such as toluene or xylene; dimethylformamide, dimethylacetamide, N-methylpyrrolidone, or the like. It is preferable to use the organic solvent at a proportion such that the non-volatile fraction is 30% to 60% by mass.

Furthermore, the method for producing a printed wiring board using the curable resin composition of the invention may be, for example, a method of impregnating a reinforcing substrate with the curable composition, curing the composition to obtain a prepreg, laminating this with a copper foil, and heating and compressing the laminate. Examples of the reinforcing substrate include paper, a glass fabric, a glass nonwoven fabric, an aramid paper, an aramid fabric, a glass mat, and a glass woven roving. The amount of impregnation of the curable resin composition is not particularly limited; however, usually, it is preferable to produce the prepreg such that the resin fraction in the prepreg is 20% to 60% by mass.

In the case of using the curable resin composition of the invention for a semiconductor encapsulating material application, generally, it is preferable to incorporate an inorganic filler material into the resin composition. The semiconductor encapsulating material can be produced by, for example, mixing a blend using an extruder, a kneader, a roll, or the like. The method of molding a semiconductor package using the semiconductor encapsulating material thus obtained may be, for example, a method of molding the semiconductor encapsulating material using a cast or transfer molding machine, an injection molding machine, or the like, and heating the resultant under the temperature conditions of 50° C. to 200° C. for 2 to 10 hours. A semiconductor device as a molded article can be obtained by such a method.

EXAMPLES

Next, the present invention will be specifically described by way of Examples and Comparative Examples. The description of the units "parts" and "percent (%)" in the Examples is on a mass basis unless particularly stated otherwise. Meanwhile, the measurement conditions for GPC, 13C-NMR, and MALDI-TOF-MS in the present Examples are as follows.

Measurement conditions for GPC
Measuring apparatus: "HLC-8320 GPC" manufactured by Tosoh Corporation
Column: Guide column "HXL-L" manufactured by Tosoh Corporation
+"TSK-GEL G4000HXL" manufactured by Tosoh Corporation
+"TSK-GEL G3000HXL" manufactured by Tosoh Corporation
+"TSK-GEL G2000HXL" manufactured by Tosoh Corporation
+"TSK-GEL G2000HXL" manufactured by Tosoh Corporation
Detector: RI (differential refractometer)
Data processing: "GPC Workstation EcoSEC-WorkStation" manufactured by Tosoh Corporation
Measurement conditions: Column temperature 40° C.
Developing solvent tetrahydrofuran
Flow rate 1.0 ml/min
Standard: The following monodisperse polystyrenes having known molecular weights were used according to the measurement manual of "GPC-8320".
(Polystyrenes Used)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation
Sample: A tetrahydrofuran solution having a concentration of 1.0% by mass in terms of the resin solid content was filtered through a microfilter (50 μl) and used.
Measurement conditions for 13C-NMR
Apparatus: ECA-500 manufactured by JEOL Ltd.
Measurement mode: SINGLE-PULSE-DEC (1H complete decoupling of
NOE elimination)
Solvent: Deuterated chloroform
Pulse angle: 30° pulse
Sample concentration: 30 wt %
Number of times of accumulation: 4,000 times
Measurement conditions for MALDI-TOF-MS
Apparatus: AXIMA-TOF2 manufactured by Shimadzu-Krstos Analytical, Ltd.
Ionization method: Matrix Assisted Laser
Desorption/Ionization Example 1: Production of Active Ester Resin (1)

Into a flask equipped with a thermometer, a dropping funnel, a cooling tube, a fractionation column, and a stirrer, 433 parts by mass of 1-naphthol, 108 parts by mass of toluene, 99 parts by mass of dicyclopentadiene, and 27 parts by mass of para-toluenesulfonic acid monohydrate were introduced. While the content of the flask was stirred, the temperature was raised to 130° C., and the mixture was caused to react by stirring for 2 hours at 130° C. After completion of the reaction, 12 parts by mass of a 49% aqueous solution of sodium hydroxide was added to the flask to neutralize the mixture, and 200 parts by mass of toluene was added thereto. The mixture was washed three times with 100 parts by mass of water. Toluene and the like were distilled off under heated and reduced pressure conditions, and 522 parts by mass of mixture (1) including unreacted 1-naphthol and a polynaphthol resin (B-1) was obtained. The hydroxyl group equivalent of the mixture (1) thus obtained was 234 g/equivalent.

Figure 1:
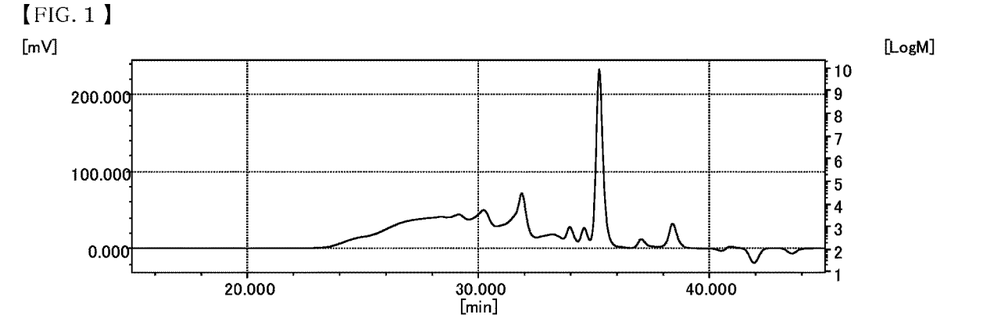
FIG. 1 is a GPC chart of an active ester resin (1) obtained in Example 1.
Figure 2:
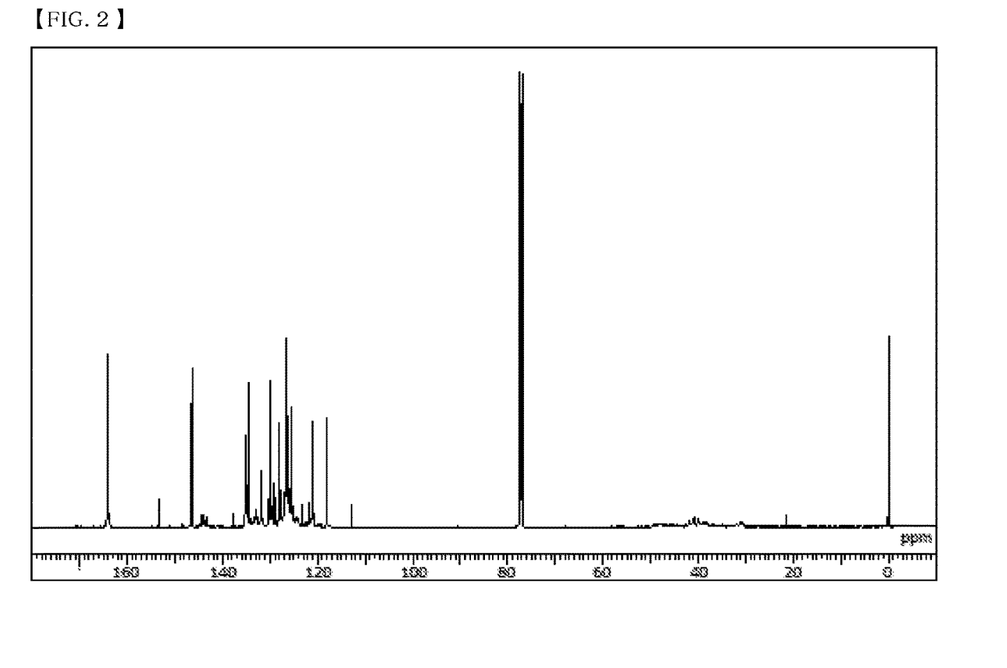
FIG. 2 is a 13C-NMR chart of the active ester resin (1) obtained in Example 1.
Figure 3:
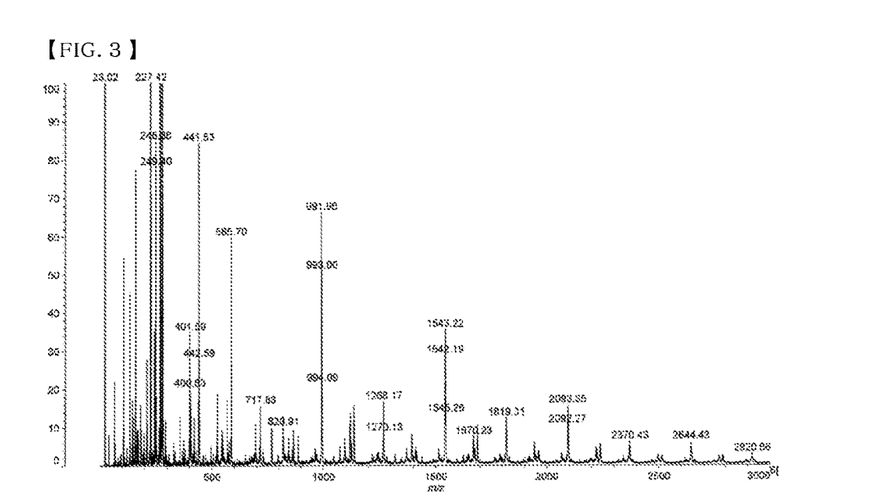
FIG. 3 is an MS chart of the active ester resin (1) obtained in Example 1.

Into a flask equipped with a thermometer, a dropping funnel, a cooling tube, a fractionation column, and a stirrer, 141 parts by mass of isophthalic acid chloride and 1,000 parts by mass of toluene were introduced, and the mixture was dissolved while the interior of the system was purged with nitrogen under reduced pressure. Subsequently, 328 parts by mass of the mixture (1) thus obtained was introduced thereinto, and the mixture was dissolved while the interior of the system was purged with nitrogen under reduced pressure. 0.4 part by mass of tetrabutylammonium bromide was added thereto, and while the flask was subjected to nitrogen gas purge, the interior of the reaction system was controlled to be 60° C. or lower. 280 parts by mass of a 20% aqueous solution of sodium hydroxide was added dropwise to the flask over 3 hours. After completion of the dropwise addition, the mixture was continuously stirred for one hour without changing the conditions and was thereby caused to react. After completion of the reaction, the reaction mixture was left to stand and partitioned, and an aqueous layer was removed. Water was added to the remaining organic layer, and the mixture was stirred and mixed for about 15 minutes. Then, the mixture was left to stand and partitioned, and an aqueous layer was removed. This operation was repeated until the pH of the aqueous layer reached 7, and then toluene and the like were distilled off under heated and reduced pressure conditions. Thus, 397 parts by mass of an active ester resin (1) was obtained. The functional group equivalent of the active ester resin (1) was 299 g/equivalent, and the softening point measured based on JIS K7234 was 151° C. A GPC chart of the active ester resin (1) thus obtained is shown in FIG. 1, a 13C-NMR chart is shown in FIG. 2, and an MS chart is shown in FIG. 3. The weight average molecular weight (Mw) of the active ester resin (1) was 1,547. Furthermore, the content of isophthalic acid dinaphthol ester in the active ester resin (1) calculated from the area ratio of the GPC chart was 20.2%.

Example 2: Production of Active Ester Resin (2)

Into a flask equipped with a thermometer, a dropping funnel, a cooling tube, a fractionation column, and a stirrer, 404 parts by mass of 1-naphthol, 500 parts by mass of toluene, 96 parts by mass of para-xylene glycol, and 6 parts by mass of para-toluenesulfonic acid monohydrate were introduced. While the content of the flask was stirred, the temperature was raised to 120° C., and the mixture was stirred for one hour at 120° C. and was caused to react. After completion of the reaction, 4 parts by mass of a 49% aqueous solution of sodium hydroxide was added to the flask to neutralize the mixture. Subsequently, 400 parts by mass of toluene was added thereto, and the mixture was washed three times with 200 parts by mass of water. Toluene and the like were distilled off under heated and reduced pressure conditions, and 448 parts by mass of a mixture (2) including unreacted 1-naphthol and a polynaphthol resin (B-2) was obtained. The hydroxyl group equivalent of the mixture (2) thus obtained was 170 g/equivalent.

Figure 4:
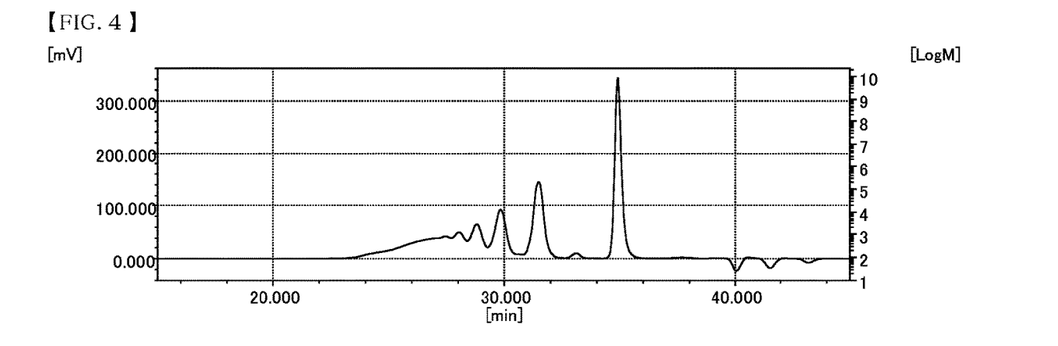
FIG. 4 is a GPC chart of an active ester resin (2) obtained in Example 2.
Figure 5:
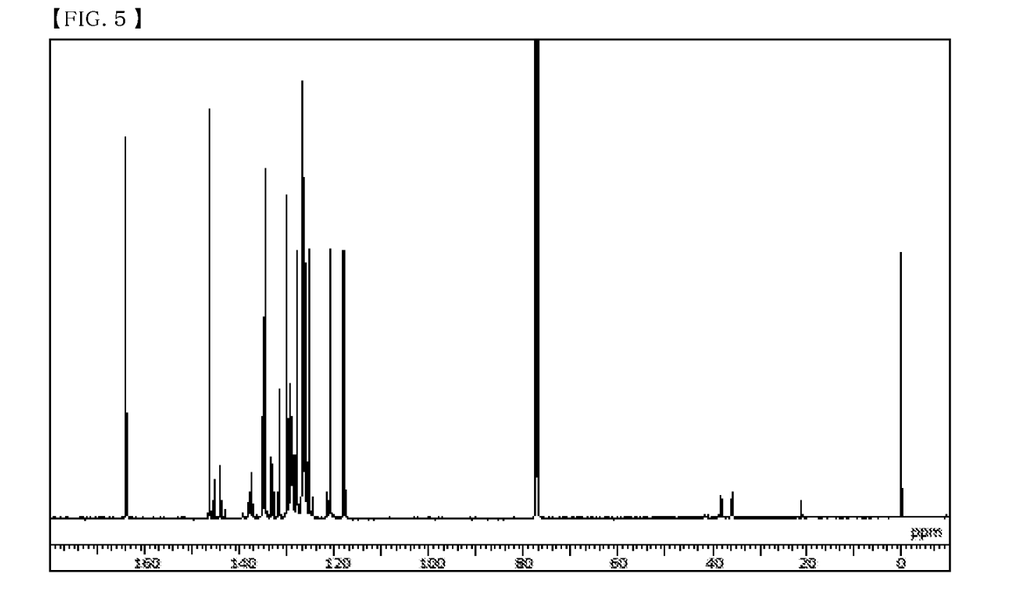
FIG. 5 is a 13C-NMR chart of the active ester resin (2) obtained in Example 2.
Figure 6:
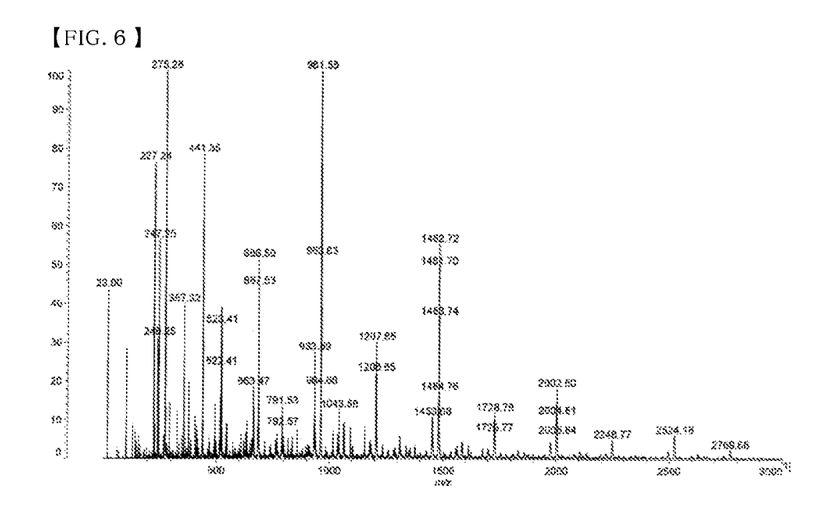
FIG. 6 is an MS chart of the active ester resin (2) obtained in Example 2.

Into a flask equipped with a thermometer, a dropping funnel, a cooling tube, a fractionation column, and a stirrer, 141 parts by mass of isophthalic acid chloride and 1,000 parts by mass of toluene were introduced, and the mixture was dissolved while the interior of the system was purged with nitrogen under reduced pressure. Next, 237 parts by mass of the mixture (2) thus obtained was introduced into the flask, and the mixture was dissolved while the interior of the system was purged with nitrogen under reduced pressure. 0.4 g of tetrabutylammonium bromide was added thereto, and while the flask was subjected to nitrogen gas purge, the interior of the reaction system was controlled to be 60° C. or lower. 280 parts by mass of a 20% aqueous solution of sodium hydroxide was added dropwise thereto over 3 hours. After completion of the dropwise addition, the mixture was continuously stirred for one hour without changing the conditions and was thereby caused to react. After completion of the reaction, the reaction mixture was left to stand and partitioned, and an aqueous layer was removed. Water was added to the remaining organic layer, and the mixture was stirred and mixed for about 15 minutes. Then, the mixture was left to stand and partitioned, and an aqueous layer was removed. This operation was repeated until the pH of the aqueous layer reached 7, and then toluene and the like were distilled off under heated and reduced pressure conditions. Thus, 311 parts by mass of an active ester resin (2) was obtained. The functional group equivalent of the active ester resin (2) was 234 g/equivalent, and the softening point measured based on JIS K7234 was 130° C. A GPC chart of the active ester resin (2) thus obtained is shown in FIG. 4, a 13C-NMR chart is shown in FIG. 5, and an MS chart is shown in FIG. 6. The weight average molecular weight (Mw) of the active ester resin (2) was 1,650. Furthermore, the content of isophthalic acid dinaphthol ester in the active ester resin (2) calculated from the area ratio of the GPC chart was 27.5%.

Example 3: Production of Active Ester Resin (3)

Into a flask equipped with a thermometer, a dropping funnel, a cooling tube, a fractionation column, and a stirrer, 404 parts by mass of 1-naphthol, 560 parts by mass of toluene, 150 parts by mass of bishydroxymethylbiphenyl, and 6 parts by mass of para-toluenesulfonic acid monohydrate were introduced. While the content of the flask was stirred, the temperature was raised to 120° C., and the mixture was stirred for one hour at 120° C. and was caused to react. After completion of the reaction, 4 parts by mass of a 49% aqueous solution of sodium hydroxide was added to the flask to neutralize the mixture, and then 400 parts by mass of toluene was added thereto. The mixture was washed three times with 200 parts by mass of water. Toluene and the like were distilled off under heated and reduced pressure conditions, and 510 parts by mass of a mixture (3) including unreacted 1-naphthol and a polynaphthol resin (B-3) was obtained. The hydroxyl group equivalent of the mixture (3) thus obtained was 189 g/equivalent.

Figure 7:
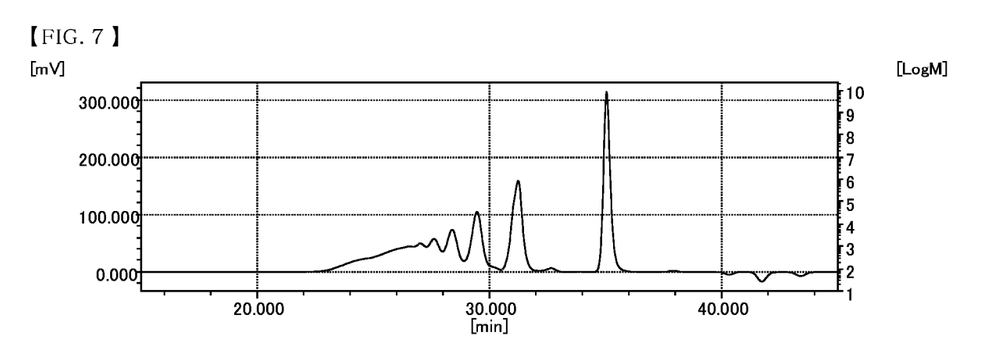
FIG. 7 is a GPC chart of an active ester resin (3) obtained in Example 3.
Figure 8:
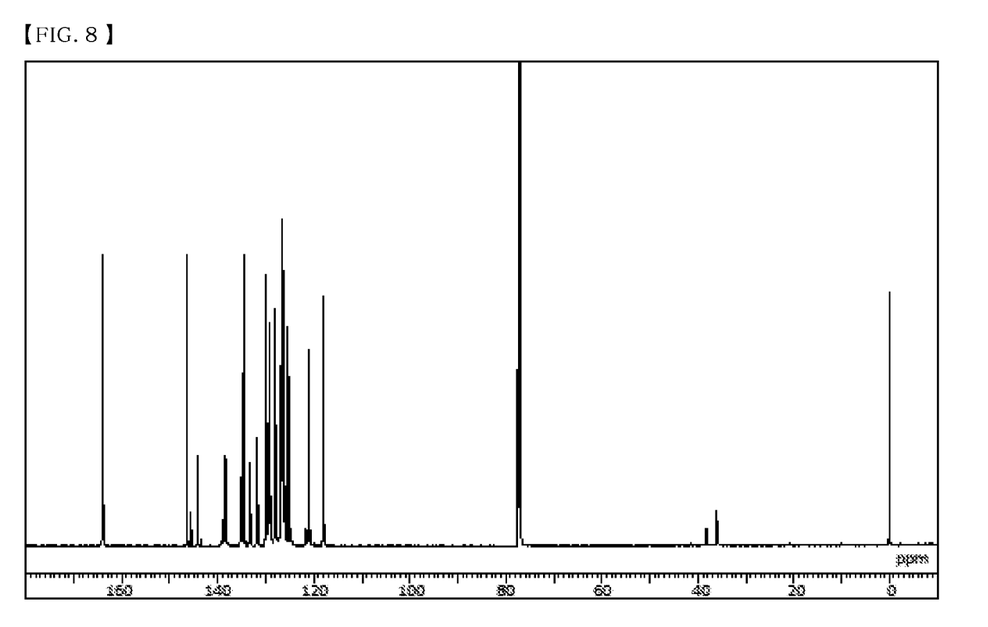
FIG. 8 is a 13C-NMR chart of the active ester resin (3) obtained in Example 3.
Figure 9:
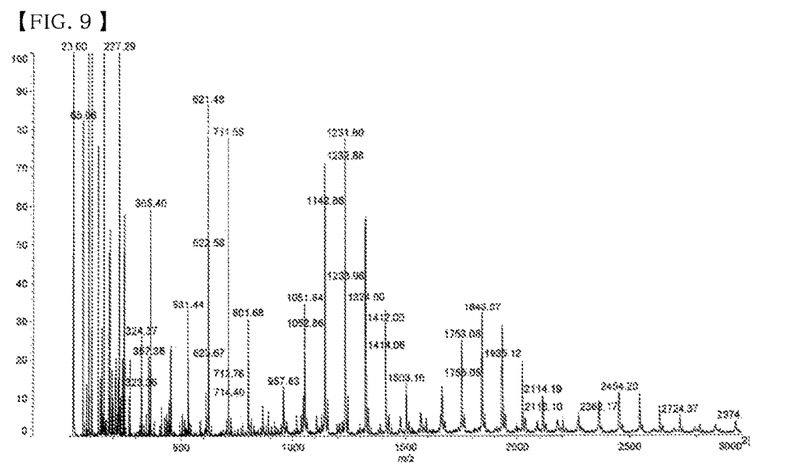
FIG. 9 is an MS chart of the active ester resin (3) obtained in Example 3.

Into a flask equipped with a thermometer, a dropping funnel, a cooling tube, a fractionation column, and a stirrer, 141 parts by mass of isophthalic acid chloride and 1,000 parts by mass of toluene were introduced, and the mixture was dissolved while the interior of the system was purged with nitrogen under reduced pressure. Next, 264 parts by mass of the mixture (3) obtained above was introduced into the flask, and the mixture was dissolved while the interior of the system was purged with nitrogen under reduced pressure. 0.4 g of tetrabutylammonium bromide was added thereto, and while the flask was subjected to nitrogen gas purge, the indie of the reaction system was controlled to be 60° C. or lower. 280 parts by mass of a 20% aqueous solution of sodium hydroxide was added dropwise thereto over 3 hours. After completion of the dropwise addition, the mixture was continuously stirred for one hour without changing the conditions and was thereby caused to react. After completion of the reaction, the reaction mixture was left to stand and partitioned, and an aqueous layer was removed. Water was added to the remaining organic layer, and the mixture was stirred and mixed for about 15 minutes. Then, the mixture was left to stand and partitioned, and an aqueous layer was removed. This operation was repeated until the pH of the aqueous layer reached 7, and then toluene and the like were distilled off under heated and reduced pressure conditions. Thus, 340 parts by mass of an active ester resin (3) was obtained. The functional group equivalent of the active ester resin (3) was 253 g/equivalent, and the softening point measured based on JIS K7234 was 144° C. A GPC chart of the active ester resin (3) thus obtained is shown in FIG. 7, a 13C-NMR chart is shown in FIG. 8, and an MS chart is shown in FIG. 9. The weight average molecular weight (Mw) of the active ester resin (3) was 2,046. Furthermore, the content of isophthalic acid dinaphthol ester in the active ester resin (3) calculated from the area ratio of the GPC chart was 24.1%.

Example 4: Production of Active Ester Resin (4)

Into a flask equipped with a thermometer, a dropping funnel, a cooling tube, a fractionation column, and a stirrer, 460 parts by mass of 1-naphthol, 200 parts by mass of toluene, 156 parts by mass of divinylbenzene ("DVB-810" manufactured by NIPPON STEEL & SUMIKIN CHEMICAL CO., LTD., divinylbenzene purity 81%), and 1 part by mass of para-toluenesulfonic acid monohydrate were introduced. While the content of the flask was stirred, the temperature was raised to 120° C., and the content was stirred for one hour at 120° C. and was caused to react. After completion of the reaction, 4 parts by mass of a 49% aqueous solution of sodium hydroxide was added to the flask to neutralize the mixture, and then 400 parts by mass of toluene was added thereto. The mixture was washed three times with 200 parts by mass of water. Toluene and the like were distilled off under heated and reduced pressure conditions, and 605 parts by mass of a mixture (4) including unreacted 1-naphthol and a polynaphthol resin (B-4) was obtained. The hydroxyl group equivalent of the mixture (4) thus obtained was 193 g/equivalent.

Figure 10:
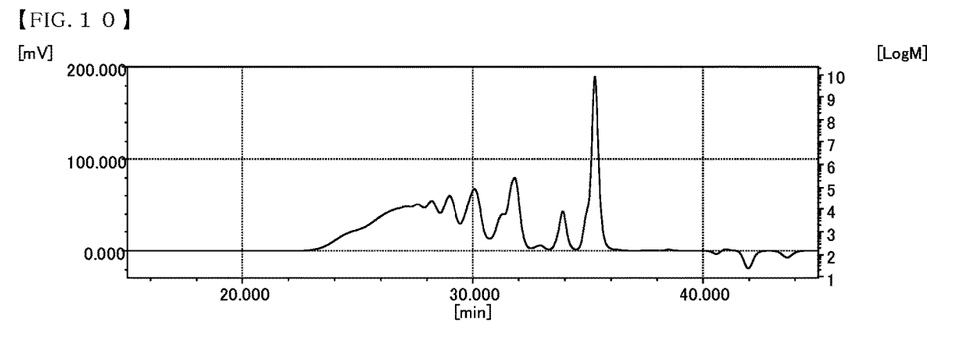
FIG. 10 is a GPC chart of an active ester resin (4) obtained in Example 4.

Into a flask equipped with a thermometer, a dropping funnel, a cooling tube, a fractionation column, and a stirrer, 162 parts by mass of isophthalic acid chloride and 1,000 parts by mass of toluene were introduced, and the mixture was dissolved while the interior of the system of purged with nitrogen under reduced pressure. Next, 308 parts by mass of the mixture (4) thus obtained was introduced into the flask, and the mixture was dissolved while the interior of the system was purged with nitrogen under reduced pressure. 0.4 g of tetrabutylammonium bromide was added thereto, and while the flask was subjected to nitrogen gas purge, the interior of the reaction system was controlled to be 60° C. or lower. 320 parts by mass of a 20% aqueous solution of sodium hydroxide was added dropwise thereto over 3 hours. After completion of the dropwise addition, the mixture was continuously stirred for one hour without changing the conditions and was thereby caused to react. After completion of the reaction, the reaction mixture was left to stand and partitioned, and an aqueous layer was removed. Water was added to the remaining organic layer, and the mixture was stirred and mixed for about 15 minutes. Then, the mixture was left to stand and partitioned, and an aqueous layer was removed. This operation was repeated until the pH of the aqueous layer reached 7, and then toluene and the like were distilled off under heated and reduced pressure conditions. Thus, 395 parts by mass of an active ester resin (4) was obtained. The functional group equivalent of the active ester resin (4) was 257 g/equivalent, and the softening point measured based on JIS K7234 was 160° C. A GPC chart of the active ester resin (4) thus obtained is shown in FIG. 10. The weight average molecular weight (Mw) of the active ester resin (4) was 1,965. Furthermore, the content of isophthalic acid dinaphthol ester in the active ester resin (4) calculated from the area ratio of the GPC chart was 18.6%.

Example 5: Production of Active Ester Resin (5)

Into a flask equipped with a thermometer, a dropping funnel, a cooling tube, a fractionation column, and a stirrer, 404 parts by mass of 1-naphthol, 480 parts by mass of toluene, 74 parts by mass of benzaldehyde, and 2 parts by mass of para-toluenesulfonic acid monohydrate were introduced. While the content of the flask was stirred, the temperature was raised to 60° C., and the mixture was stirred for one hour at 60° C. and was thereby caused to react. After completion of the reaction, 2 parts by mass of a 49% aqueous solution of sodium hydroxide was added thereto to neutralize the mixture, and then 400 parts by mass of toluene was added thereto. The mixture was washed three times with 200 parts by mass of water. Under heated and reduced pressure conditions, toluene and the like were distilled off, and 420 parts by mass of a mixture (5) including unreacted 1-naphthol and a polynaphthol resin (B-5) was obtained. The hydroxyl group equivalent of the mixture (5) thus obtained was 166 g/equivalent.

Figure 11:
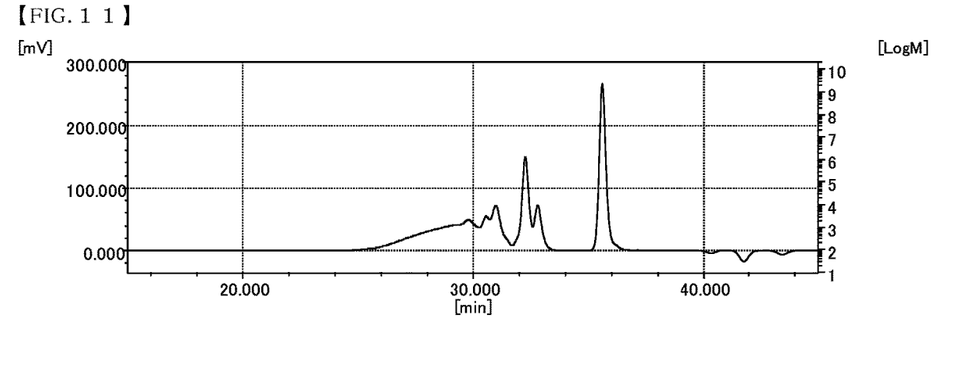
FIG. 11 is a GPC chart of an active ester resin (5) obtained in Example 5.

Into a flask equipped with a thermometer, a dropping funnel, a cooling tube, a fractionation column, and a stirrer, 141 parts by mass of isophthalic acid chloride and 1,000 parts by mass of toluene were introduced, and while the interior of the system was purged with nitrogen under reduced pressure, the mixture was dissolved. Next, 263 parts by mass of the mixture (5) thus obtained was introduced into the flask, and the mixture was dissolved while the interior of the system was purged with nitrogen under reduced pressure. 0.4 g of tetrabutylammonium bromide was added to the flask, and while the flask was subjected to nitrogen gas purge, the interior of the reaction system was controlled to be 60° C. or lower. 280 parts by mass of a 20% aqueous solution of sodium hydroxide was added dropwise thereto over 3 hours. After completion of the dropwise addition, the mixture was continuously stirred for one hour without changing the conditions, and thereby, the mixture was caused to react. After completion of the reaction, the reaction mixture was left to stand and partitioned, and an aqueous layer was removed. Water was added to the remaining organic layer, and the mixture was stirred and mixed for about 15 minutes. Then, the mixture was left to stand and partitioned, and an aqueous layer was removed. This operation was repeated until the pH of the aqueous layer reached 7, and then toluene and the like were distilled off under heated and reduced pressure conditions. Thus, 312 parts by mass of an active ester resin (5) was obtained. The functional group equivalent of the active ester resin (5) was 231 g/equivalent, and the softening point measured based on JIS K7234 was 146° C. A GPC chart of the active ester resin (5) thus obtained is shown in FIG. 11. The weight average molecular weight (Mw) of the active ester resin (5) was 1,024. Furthermore, the content of isophthalic acid dinaphthol ester in the active ester resin (5) calculated from the area ratio of the GPC chart was 26.0%.

Comparative Production Example 1: Production of Active Ester Resin (1')

Into a flask equipped with a thermometer, a dropping funnel, a cooling tube, a fractionation column, and a stirrer, 165 parts by mass of an addition reaction product of dicyclopentadiene and phenol (hydroxyl group equivalent 165 g/equivalent, softening point 85° C.), 72 parts by mass of 1-naphthol, and 630 parts by mass of toluene were introduced, and while the interior of the system was purged with nitrogen under reduced pressure, the mixture was dissolved. Next, 152 parts by mass of isophthalic acid chloride was introduced into the flask, and while the interior of the system was purged with nitrogen under reduced pressure, the mixture was dissolved. While the flask was subjected to nitrogen gas purge, the interior of the system was controlled to be 60° C. or lower, and 210 g of a 20% aqueous solution of sodium hydroxide was added dropwise thereto over 3 hours. After completion of the addition, the mixture was continuously stirred for one hour without changing the conditions, and thereby the mixture was caused to react. After completion of the reaction, the reaction mixture was left to stand and partitioned, and an aqueous layer was removed. Water was added to the remaining organic layer, and the mixture was stirred and mixed for about 15 minutes. Then, the mixture was left to stand and partitioned, and an aqueous layer was removed. This operation was repeated until the pH of the aqueous layer reached 7, and then toluene and the like were distilled off under heated and reduced pressure conditions. Thus, an active ester resin (1') was obtained. The functional group equivalent of the active ester resin (1') was 223 g/equivalent, and the softening point measured based on JIS K7234 was 150° C.

Comparative Production Example 2: Production of Active Ester Resin (2')

Into a flask equipped with a thermometer, a dropping funnel, a cooling tube, a fractionation column, and a stirrer, 104 g of a phenol novolac resin ("PHENOLITE TD-2131" manufactured by DIC Corporation, softening point 80° C., hydroxyl group equivalent 104) and 612 g of methyl isobutyl ketone (hereinafter, abbreviated to "MIBK") were introduced, and while the interior of the system was purged with nitrogen under reduced pressure, the mixture was dissolved. Next, 10.1 g (0.05 mol) of isophthalic acid chloride was introduced into the flask, and then while the flask was subjected to nitrogen gas purge, the interior of the system was controlled to be 60° C. 21.0 g of a 20% aqueous solution of sodium hydroxide was added dropwise to the mixture over one hour. Next, under these conditions, stirring was continued for 1.0 hour. Next, 133.5 g (0.90 mol) of benzoyl chloride was introduced into the flask, and subsequently, while nitrogen gas purging was performed, the interior of the system as controlled to be 60° C. or lower. 189.0 g of a 20% aqueous solution of sodium hydroxide was added dropwise thereto over 4 hours. Next, stirring was continued under these conditions for 1.0 hours. After completion of the reaction, the reaction system was left to stand and partitioned, and an aqueous layer was removed. Furthermore, water was introduced into the MIBK phase in which the reaction product was dissolved, and the mixture was stirred and mixed for about 15 minutes. The mixture was left to stand and partitioned, and the aqueous layer was removed. This operation was repeated until the pH of the aqueous layer reached 7. Subsequently, moisture was removed by decantation and dehydration, and subsequently, MIBK was removed by dehydration under reduced pressure. Thus, an active ester resin (2') was obtained. The functional group equivalent of this active ester resin (2') was 204 g/equivalent from the feed ratio, and the softening point was 92° C.

Examples 6 to 10 and Comparative Examples 1 and 2

Various components were mixed at the proportions indicated in the following Table 1, and thus curable resin compositions were obtained. For the curable resin compositions thus obtained, the cure shrinkage and the dielectric loss tangent value of the cured products were measured by the methods described below. The results are presented in Table 1.

Measurement of Cure Shrinkage

A curable resin composition was injection-molded using a transfer molding machine ("KTS-15-1.5C" manufactured by Kohtaki Precision Machine Co., Ltd.) under the conditions of a mold temperature of 154° C., a molding pressure of 9.8 MPa, and a curing time of 600 seconds, and a molded product having a length of 110 mm, a width of 12.7 mm, and a thickness of 1.6 mm was obtained. Next, the molded product thus obtained was cured for 5 hours at 175° C., and then the molded product was left to stand for 24 hours or longer at room temperature (25° C.). This was used as a specimen. The dimension in the longitudinal direction of the specimen at room temperature, and the dimension in the longitudinal direction of the mold at 154° C. were respectively measured, and the cure shrinkage was calculated by the following Formula.

Cure shrinkage (%)={(Dimension in longitudinal direction of mold at 154° C.)−(dimension in longitudinal direction of specimen at room temperature)}/(dimension in longitudinal direction of mold at 154° C.)×100(%)

Measurement of Dielectric Loss Tangent

A specimen was produced in the same manner as in the measurement of the cure shrinkage. After heating and drying in a vacuum, for the specimen stored indoors at 23° C. and a humidity of 50% for 24 hours, the dielectric loss tangent at 1 GHz was measured by a cavity resonance method using a network analyzer "E8362C" manufactured by Agilent Technologies, Inc.

TABLE 1

|  | Example 6 | Example 7 | Example 8 | Example 9 | Example 10 | Comparative Example 1 | Comparative Example 2 |
|---|---|---|---|---|---|---|---|
| Active ester resin (1) [parts by mass] | 61.4 |  |  |  |  |  |  |
| Active ester resin (2) [parts by mass] |  | 55.5 |  |  |  |  |  |
| Active ester resin (3) [parts by mass] |  |  | 57.4 |  |  |  |  |
| Active ester resin (4) [parts by mass] |  |  |  | 57.8 |  |  |  |

TABLE 1-continued

|  | Example 6 | Example 7 | Example 8 | Example 9 | Example 10 | Comparative Example 1 | Comparative Example 2 |
|---|---|---|---|---|---|---|---|
| Active ester resin (5) [parts by mass] |  |  |  |  | 55.1 |  |  |
| Active ester resin (1') [parts by mass] |  |  |  |  |  | 54.3 |  |
| Active ester resin (2') [parts by mass] |  |  |  |  |  |  | 52.0 |
| Epoxy resin (*) [parts by mass] | 38.6 | 44.5 | 42.6 | 42.2 | 44.9 | 45.7 | 48.0 |
| Dimethylaminopyridine [parts by mass] | 0.5 | 0.5 | 0.5 | 0.5 | 0.5 | 0.5 | 0.5 |
| Cure shrinkage [%] | 0.70 | 0.65 | 0.62 | 0.71 | 0.68 | 1.02 | 0.98 |
| Dielectric loss tangent (1 GHz) | 0.0052 | 0.0059 | 0.0053 | 0.0052 | 0.0059 | 0.0078 | 0.0092 |

Epoxy resin (*): Bisphenol A type epoxy resin ("EPICLON 850-S" manufactured by DIC Corporation, epoxy equivalent 188 g/equivalent)

The invention claimed is:

1. An active ester resin comprising a product of reaction of essential raw materials including:
   a phenolic hydroxyl group-containing compound (A);
   a polynaphthol resin (B) having a molecular structure in which naphthol compound (b) moieties are linked with an aromatic ring- or cyclo ring-containing structural moiety (α); and
   an aromatic polycarboxylic acid or an acid halide thereof (C),
   wherein the ratio between the number of moles of hydroxyl groups ($A_{OH}$) in the phenolic hydroxyl group-containing compound (A) and the number of moles of hydroxyl groups ($B_{OH}$) in the polynaphthol resin (B), [($A_{OH}$)/($B_{OH}$)], is 10/90 to 75/25,
   wherein the polynaphthol resin (B) has a molecular structure represented by the following structural formula (1):

[Chem. 1]

(1)

wherein X represents an aromatic ring- or cyclo ring-containing structural moiety (α); $R^1$'s each independently represent any one of an aliphatic hydrocarbon group, an alkoxy group, a halogen atom, an aryl group, an aralkyl group, and a structural moiety (β) represented by the following structural formula (2):

[Chem. 2]

(2)

wherein X represents an aromatic nucleus- or cyclo ring-containing structural moiety (α); $R^1$'s each independently represent any one of an aliphatic hydrocarbon group, an alkoxy group, a halogen atom, an aryl group, an aralkyl group, and a structural moiety (β) represented by structural formula (2), and each of $R^1$'s may be bonded to any carbon atom forming the naphthalene ring; m represents 0 or an integer from 1 to 4; and n represents an integer from 1 to 10;
   and each of $R^1$'s may be bonded to any carbon atom forming the naphthalene ring; m represents 0 or an integer from 1 to 4; and n represents an integer from 1 to 10.

2. The active ester resin according to claim 1, wherein X in structural formulas (1) and (2) represents a structural moiety represented by any one of the following structural formulas (X-1) to (X-5):

[Chem. 3]

(X-1)

(X-2)

(X-3)

(X-4)

(X-5)

wherein h represents 0 or 1; $R^2$'s each independently represent any one of an aliphatic hydrocarbon group, an alkoxy group, a halogen atom, an aryl group, and an aralkyl group; i represents 0 or an integer from 1 to 4; $R^3$ represents a hydrogen atom or a methyl group; Y represents any one of an alkylene group having 1 to 4 carbon atoms, an oxygen atom, a sulfur atom, and a carbonyl group; and j represents an integer from 1 to 4.

3. The active ester resin according to claim 1, wherein the total of the number of moles of hydroxyl groups in the phenolic hydroxyl group-containing compound (A) and the number of moles of hydroxyl groups in the polynaphthol resin (B) is 0.95 to 1.05 moles based on 1 mole of the total amount of carboxyl groups or acid halide groups in the aromatic polycarboxylic acid or an acid halide thereof (C).

4. The active ester resin according to claim 1, which comprises an ester compound (AC) of the phenolic hydroxyl group-containing compound (A) and the aromatic polycarboxylic acid or an acid halide thereof (C).

5. The active ester resin according to claim 4, wherein the content of the ester compound (AC) is in the range of 1% to 30%.

6. A curable resin composition comprising: the active ester resin according to claim 1; and a curing agent.

7. A curable resin composition comprising: the active ester resin according to claim 2; and a curing agent.

8. A curable resin composition comprising: the active ester resin according to claim 3; and a curing agent.

9. A curable resin composition comprising: the active ester resin according to claim 4; and a curing agent.

10. A cured product comprising a product obtained by curing the curable resin composition according to claim 6.

11. A printed wiring board comprising a product produced using the curable resin composition according to claim 6.

12. A semiconductor encapsulating material comprising the curable resin composition according to claim 6.

13. An active ester resin comprising a product of reaction of essential raw materials including:
a phenolic hydroxyl group-containing compound (A);
a polynaphthol resin (B) having a molecular structure in which naphthol compound (b) moieties are linked with an aromatic ring- or cyclo ring-containing structural moiety (α); and
an aromatic polycarboxylic acid or an acid halide thereof (C),
wherein the ratio between the number of moles of hydroxyl groups ($A_{OH}$) in the phenolic hydroxyl group-containing compound (A) and the number of moles of hydroxyl groups ($B_{OH}$) in the polynaphthol resin (B), $[(A_{OH})/(B_{OH})]$, is 10/90 to 75/25,
wherein the polynaphthol resin (B) is a product of reaction of essential raw materials including: a naphthol compound (b) and a compound (x) represented by any one of the following structural formulas (x-1) to (x-5):

[Chem. 4]

wherein h represents 0 or 1; $R^2$'s each independently represent any one of an aliphatic hydrocarbon group, an alkoxy group, a halogen atom, an aryl group, and an aralkyl group; i represents 0 or an integer from 1 to 4; Z represents any one of a vinyl group, a halomethyl group, a hydroxymethyl group, and an alkyloxymethyl group; Y represents any one of an alkylene group having 1 to 4 carbon atoms, an oxygen atom, a sulfur atom, and a carbonyl group; and j represents an integer from 1 to 4.

14. A curable resin composition comprising: the active ester resin according to claim 13; and a curing agent.

15. The active ester resin according to claim 13, wherein the total of the number of moles of hydroxyl groups in the phenolic hydroxyl group-containing compound (A) and the number of moles of hydroxyl groups in the polynaphthol resin (B) is 0.95 to 1.05 moles based on 1 mole of the total amount of carboxyl groups or acid halide groups in the aromatic polycarboxylic acid or an acid halide thereof (C).

16. The active ester resin according to claim 13, which comprises an ester compound (AC) of the phenolic hydroxyl group-containing compound (A) and the aromatic polycarboxylic acid or an acid halide thereof (C).

17. The active ester resin according to claim 16, wherein the content of the ester compound (AC) is in the range of 1% to 30%.

18. A cured product comprising a product obtained by curing the curable resin composition according to claim 14.

19. A printed wiring board comprising a product produced using the curable resin composition according to claim 14.

20. A semiconductor encapsulating material comprising the curable resin composition according to claim 14.

* * * * *